(12) United States Patent
Kim (10) Patent No.: US 6,870,408 B2
(45) Date of Patent: Mar. 22, 2005

(54) POWER-UP CIRCUIT

(75) Inventor: Kyung Whan Kim, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/788,178

(22) Filed: Feb. 26, 2004

(65) Prior Publication Data

US 2004/0164775 A1 Aug. 26, 2004

Related U.S. Application Data

(63) Continuation of application No. 10/331,303, filed on Dec. 30, 2002, now Pat. No. 6,731,143.

(30) Foreign Application Priority Data

Jul. 19, 2002 (KR) ......................... 2002-42491

(51) Int. Cl.[7] ................................. H03L 7/00
(52) U.S. Cl. ....................... 327/143; 327/198
(58) Field of Search ................. 326/112, 119, 326/121, 122; 327/142, 143, 198, 199, 208, 210, 223, 225

(56) References Cited

U.S. PATENT DOCUMENTS

| | | | |
|---|---|---|---|
| 4,700,089 A | * | 10/1987 | Fujii et al. .................. 327/288 |
| 5,166,546 A | | 11/1992 | Savignac et al. |
| 5,612,641 A | | 3/1997 | Sali |
| 5,825,220 A | | 10/1998 | Kinugasa et al. |
| 6,410,966 B2 | * | 6/2002 | Takahashi et al. .......... 257/368 |
| 6,469,552 B2 | | 10/2002 | Ohbayashi et al. |

* cited by examiner

*Primary Examiner*—Jeffrey Zweizig
(74) *Attorney, Agent, or Firm*—Marshall, Gerstein & Borun LLP (57) ABSTRACT

A power-up circuit comprises a first PMOS transistor connected between the power supply and a first node, wherein a gate terminal of the first PMOS transistor is connected to the ground, a first voltage divider for dividing the power upon a power up, a first NMOS transistor driven an output of the first voltage divider upon a power up and connected between the first node and the ground, an inverter having a plurality of PMOS transistors connected between the power supply and a second node, in which gate electrodes of the plurality of inverter are connected from each other and a second NMOS transistor connected between the second node and the ground and gate of the second NMOS transistor is connected to the plurality of the PMOS transistors, thereby inverting the potential of the first node, and a third NMOS transistor connected between the first node and the ground, wherein the third NMOS transistor is turned on by an output of the inverter, thereby preventing shifting faster than the potential of the first node.

8 Claims, 6 Drawing Sheets

POWER-UP CIRCUIT

This is a continuation of U.S. Ser. No. 10/331,303, filed Dec. 30, 2002 now U.S. Pat. No. 6,731,143, the entire disclosure of which is incorporated herein by reference.

BACKGROUND

1. Technical Field

A power-up circuit is disclosed which sets an initializing voltage so that the circuit can be normally driven at a time point when the power is on.

2. Description of the Related Art

Initialization and power-up circuits have been employed to reduce power consumption in semiconductor circuitry. However, currently available initialization and power-up circuits are not without their problems.

For example, an initializing circuit serves to keep a desired voltage at a node of the circuit for which initialization is required until the supply voltage reaches a specific voltage. However, if the supply power itself is low, there is a possibility that an initialization process may need to be repeated in the circuit because of power noise, etc.

Figure 1A:
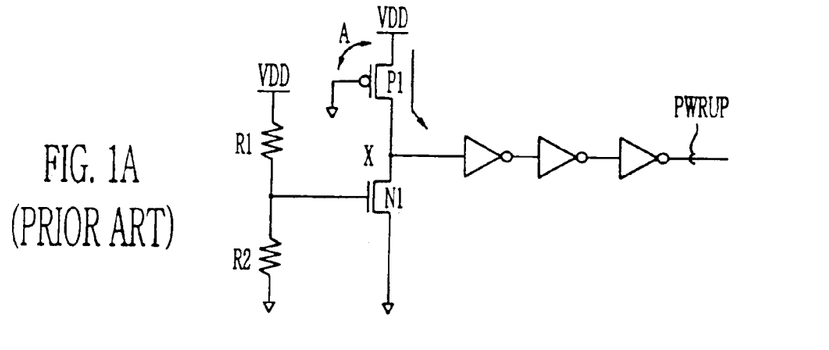
FIG. 1a and FIG. 1b are conventional power-up circuits.
Figure 1B:
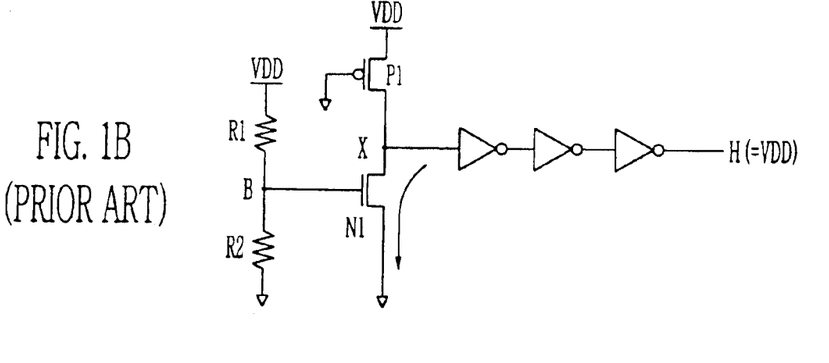

FIG. 1a and FIG. 1b show an operation principle of a conventional power-up circuit. FIG. 1a and FIG. 1b respectively show an initialization state and a state where initialization is completed.

Figure 1C:
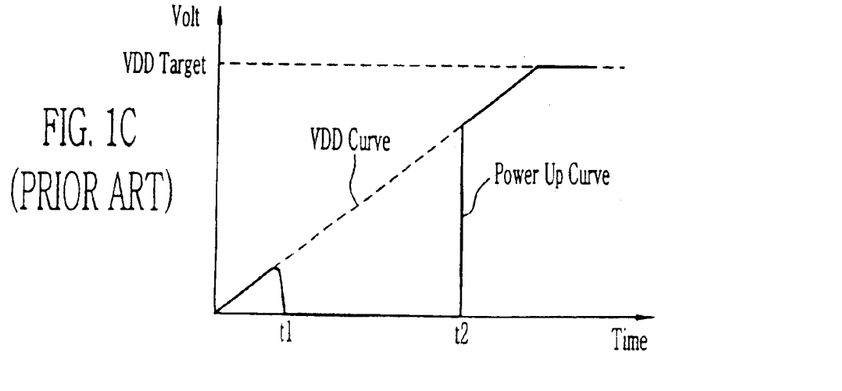
FIG. 1c is a timing diagram for explaining the operations of the power-up circuits shown in FIG. 1a and FIG. 1b.

When the power is on, the power reaches the supply voltage level within a short period of time. It can be seen that the power is increased at a given rate over a very short time unit. FIG. 1c shows the power curve against time. In FIG. 1c, a dotted line corresponds to the power curve when the power is on. Also, a solid line shows the voltage of the power-up node (PWRUP) in FIG. 1a.

Let us divide the operation of the power-up circuit into three regions. A first region is one where the voltage of the power-up node (PWRUP) is increased while the power is increased. This corresponds to a region before t1 in FIG. 1c. The reason why this region exists is that the PMOS transistor P1 in FIG. 1a is not turned on. A second region is one where the voltage a between the gate and source of the PMOS transistor P1 is sufficiently increased and a VDD value (logically HIGI value) is thus transferred to a node X. At this time, the power-up node (PWRUP) logically has a LOW value. This corresponds to the region between t1 and t2 in FIG. 1c. A third region is one where as the power is increased, the voltage of a node B in FIG. 1b is increased and a NMOS transistor N1 is turned on. At this time, the node X is discharged to logically have a LOW value and the power-up node (PWRUP) becomes logically HIGH. The voltage of the power-up node (PWRUP) after this region is same to the VDD voltage and the power-up is completed.

Figure 2:
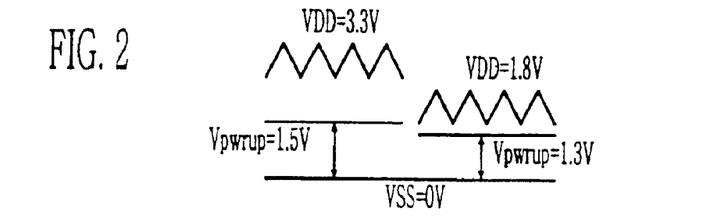
FIG. 2 shows a correlation between power noise and a power-up level.

FIG. 2 represents problems in the existing power-up circuit occurring at a low-power condition. In detail, FIG. 2 shows a correlation between power noise and the power-up level.

If noise exists in VDD under the low-power condition, it can be seen there is a possibility that the power-up level may be affected. By referring again to FIG. 1b, when the voltage of the node B is lowered due to power noise, the NMOS transistor N1 may not be sufficiently turned on. In this case, there is a significant problem that initialization can repeat itself since the power-up node (PWRUP) has a LOW value instantaneously. The possibility that this problem may occur is small as the difference between the VDD level and the power-up level is large. Thus, this is not a significant subject to be considered in the existing power-up circuit. However, as the VDD level is increasingly low, this problem becomes a subject that is necessarily considered.

SUMMARY OF THE DISCLOSURE

To solve the above problems, a power-up circuit is disclosed which is capable of preventing erroneous operation that may occur in an initialization process for a circuit that operates under a low-power condition.

A power-up circuit is also disclosed that can be applied to simple circuit systems and general VLSI systems.

A disclosed power-up circuit comprises a first PMOS transistor connected between the power supply and a first node, wherein a gate terminal of the first PMOS transistor is connected to the ground, a first voltage divider for dividing the power upon a power up, a first NMOS transistor driven an output of the first voltage divider upon a power up and connected between the first node and the ground, an inverter having a plurality of PMOS transistors connected between the power supply and a second node, in which gate electrodes of the plurality of inverter are connected from each other and a second NMOS transistor connected between the second node and the ground and gate of the second NMOS transistor is connected to the plurality of the PMOS transistors, thereby inverting the potential of the first node, and a third NMOS transistor connected between the first node and the ground, wherein the third NMOS transistor is turned on by an output of the inverter, thereby preventing shifting faster than the potential of the first node.

BRIEF DESCRIPTION OF THE DRAWINGS

The aforementioned aspects and other features of the disclosed power-up circuits will be explained in the following description, taken in conjunction with the accompanying drawings, wherein:

FIG. 4b is a timing diagram for explaining the operation of the power-up circuit shown in FIG. 4a;

FIG. 5b is a timing diagram for explaining the operation of the power-up circuit shown in FIG. 5a.

DETAILED DESCRIPTION OF THE PRESENTLY PREFERRED EMBODIMENTS

The disclosed circuits will be described in detail by way of four preferred embodiments with reference to accompanying drawings, in which like reference numerals are used to identify like or similar parts.

Figure 3A:
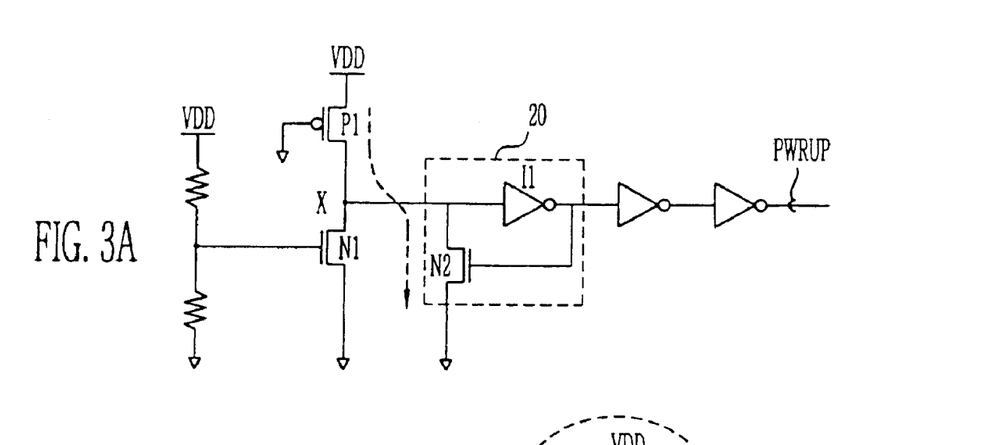
FIG. 3a shows a power-up circuit according to a first embodiment.
Figure 3B:
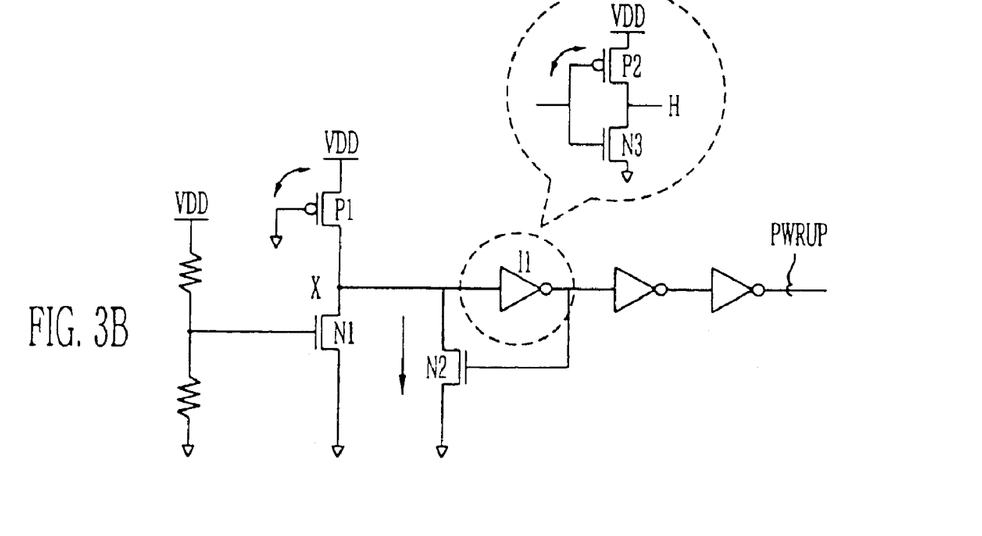
FIG. 3b shows the power-up circuit shown in FIG. 3a for explaining an initializing phenomenon.

FIG. 3a and FIG. 3b illustrate a method of solving the problem experienced by existing power-up circuits.

Referring to FIG. 3a, a NMOS transistor N2 that is connected between a node X connected between a PMOS transistor P1 and a NMOS transistor N1, and a ground, in which the NMOS transistor N2 is operated by an output of a first inverter I1. A NMOS latch 20 is constructed by the first inverter I1 and the NMOS transistor N2. If the power VDD is lowered due to external noise, etc., the NMOS transistor N1 may be turned off. At this time, as the VDD level is transferred to the node X since the PMOS transistor P1 is turned on. In this situation, if the NMOS transistor N2 does not exist, an initialization operation may happen again. On the contrary, as shown in FIG. 3a, if the NMOS transistor N2 is used, electric charges are transferred to the ground since the NMOS transistor N2 is turned on when the VDD level is transferred to the node X. Thus, the node X can have a LOW state.

However, this method may have a problem that the initialization operation is not performed upon slow power up, as shown in FIG. 3b. The slow power up means that the power VDD is slowly increased. For example, it takes several milliseconds until all the power VDD reaches.

Referring to FIG. 3b, a first inverter I1 connected to a node X has a structure in which a PMOS transistor P2 and a NMOS transistor N3 are serially connected. In the initialization operation, as the PMOS transistor P1 connected to the node X is turned on, the VDD level is transferred to the node X. As the VDD is slowly increased at the PMOS transistor P2 of the first inverter I1, the above phenomenon happens. Due to this, a node H becomes the VDD level faster than the node X in FIG. 3b. If this phenomenon happens, as the NMOS transistor N2 is already turned on even though the PMOS transistor P1 connected to the node X is turned on, the node X has always a LOW value. Thus, the power-up node (PWRUP) has always the VDD level. This means that the initialization operation, being an original purpose of power-up circuits, is not performed.

Figure 3C:
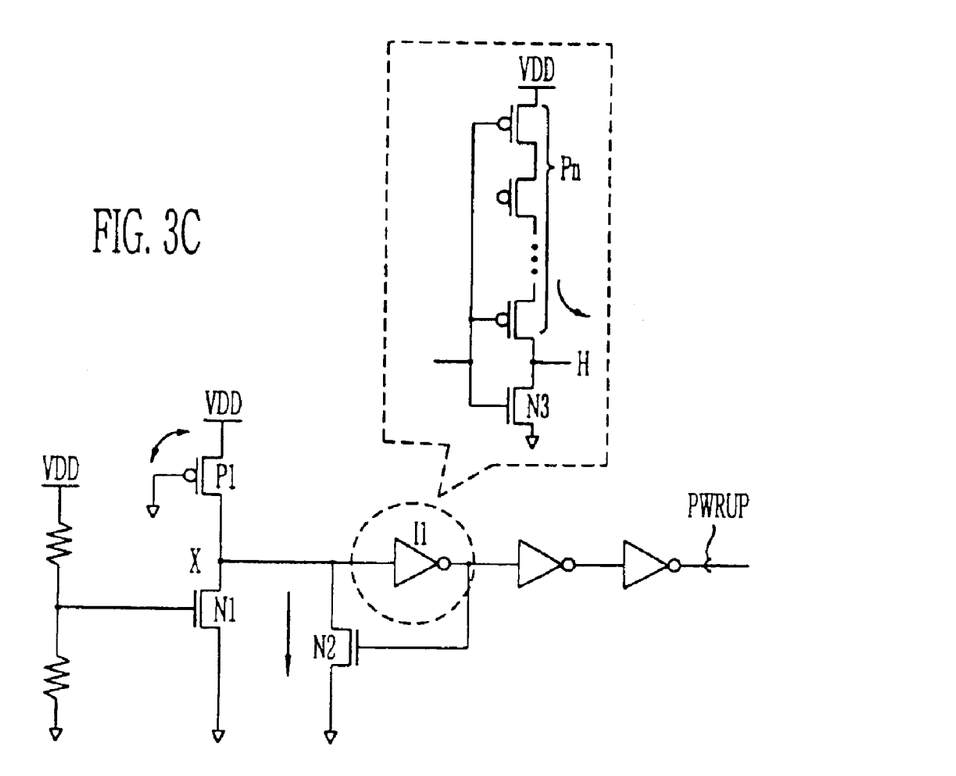
FIG. 3c shows the power-up circuit in which problems in FIG. 3a are solved by the disclosed circuits.

FIG. 3c shows the power-up circuit for solving the problem of the power-up circuit shown in FIG. 3a.

The problem can be solved by making the node H being the output of the inverter I1 have a logically HIGH value later than the node X. For this, the PMOS transistor P2 of the inverter I1 has a structure in which a plurality of PMOS transistors Pn having a relatively high resistance component are serially connected. Thus, as the VDD is increased, the time point when the PMOS transistor Pn of the inverter I1 is made later than the time point when the PMOS transistor P1 is increased.

Figure 4A:
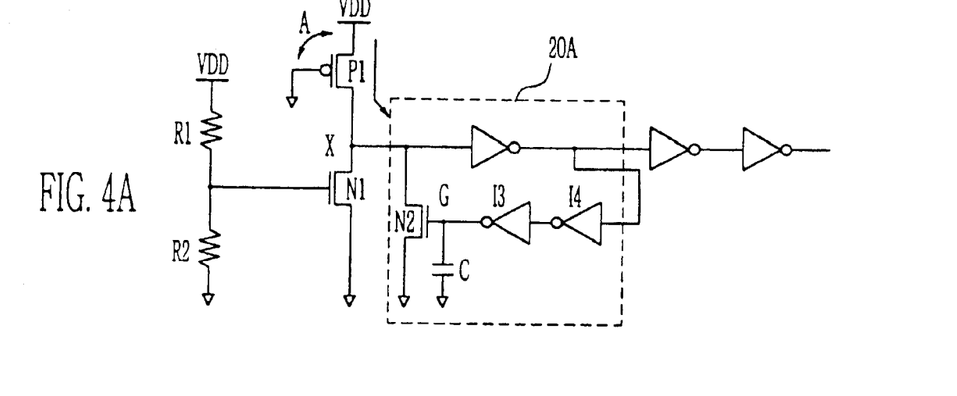
FIG. 4a shows a power-up circuit according to a second embodiment.

FIG. 4a shows a power-up circuit for solving the problem of the power-up circuit shown in FIG. 3b according to a second embodiment of the present invention.

Figure 4B:
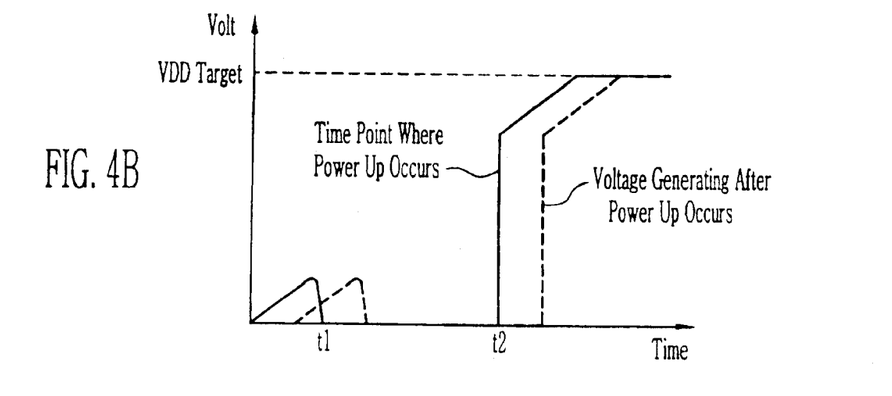

If a NMOS latch 20 of FIG. 3a is used, it is required that the NMOS latch 20 be turned on only after the initialization operation is performed. For this purpose, the voltage of a node G is made to have a HIGH level after a given time period so that the latch 20A can be turned on after the power is on. In order to delay the latch 20 for a given period of time, an even-number inverters I3 and I4 and a capacitor C are added, as shown in FIG. 4a. At this time, it is required that the power supplied to the inverters I3 and I4 is not the VDD but the power generating after the power is on as indicated by a dotted line in FIG. 4b. If the power source is supplied by the system, the power source can be used. However, if the power source is not supplied, the method shown in FIG. 5a may be used.

Figure 5A:
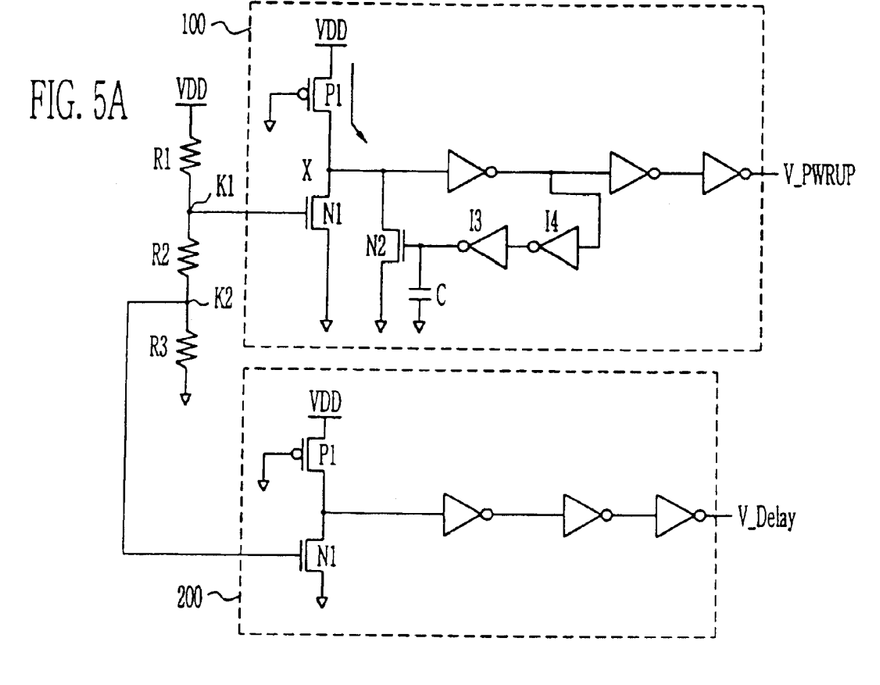
FIG. 5a shows a power-up circuit according to a third embodiment.

FIG. 5a is circuit diagram for making a voltage (V_Delay) generating after a given time delay after the power up is completed.

It is assumed that a gate of the NMOS transistor N1 is connected to a first node K1 in the original power-up circuit. A resistor R2 is connected between the first node K1 and a second node K2 and a resistor R3 is connected between the second node K2 and the ground. Also, a second power-up circuit 200 is connected to the second node K2.

Figure 5B:
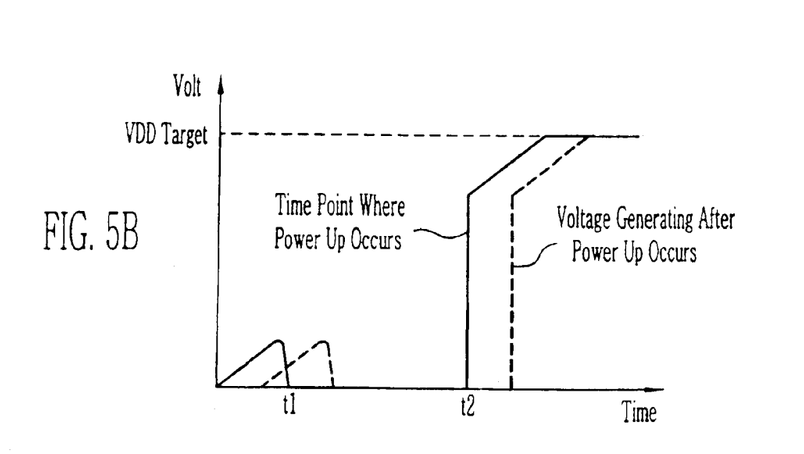

The second power-up circuit 200 has the same structure to the power-up circuit shown in FIG. 1 except for the resistors R1 and R2. The first node K1 has a higher voltage than the second node K2. The power up is faster generated in the first power-up circuit 100 than in the second power-up circuit 200. If this is shown using a curve, the curve shown in FIG. 5b can be obtained. As a result, if such dual power-up circuit is constructed, it can be seen that the power source having given time delay can be formed. In this method, however, there are the following problems.

The power V_Delay formed by the second power-up circuit 200 is generated after the first power up. However, when the VDD value is reduced, the power V_Delay becomes a power that is turned off earlier than V_PWRUP. If this power source is used the power of the inverter for time delay in the even-numbered stage, a phenomenon that V_PWRUP is instantaneously turned off due to power noise, etc. (state that the initialization operation again occurs) cannot be prevented using the NMOS latch. This is because V_Delay supplied to the even-numbered inverters for time delay before V_PWRUP is turned off is turned off before the above time.

Figure 6:
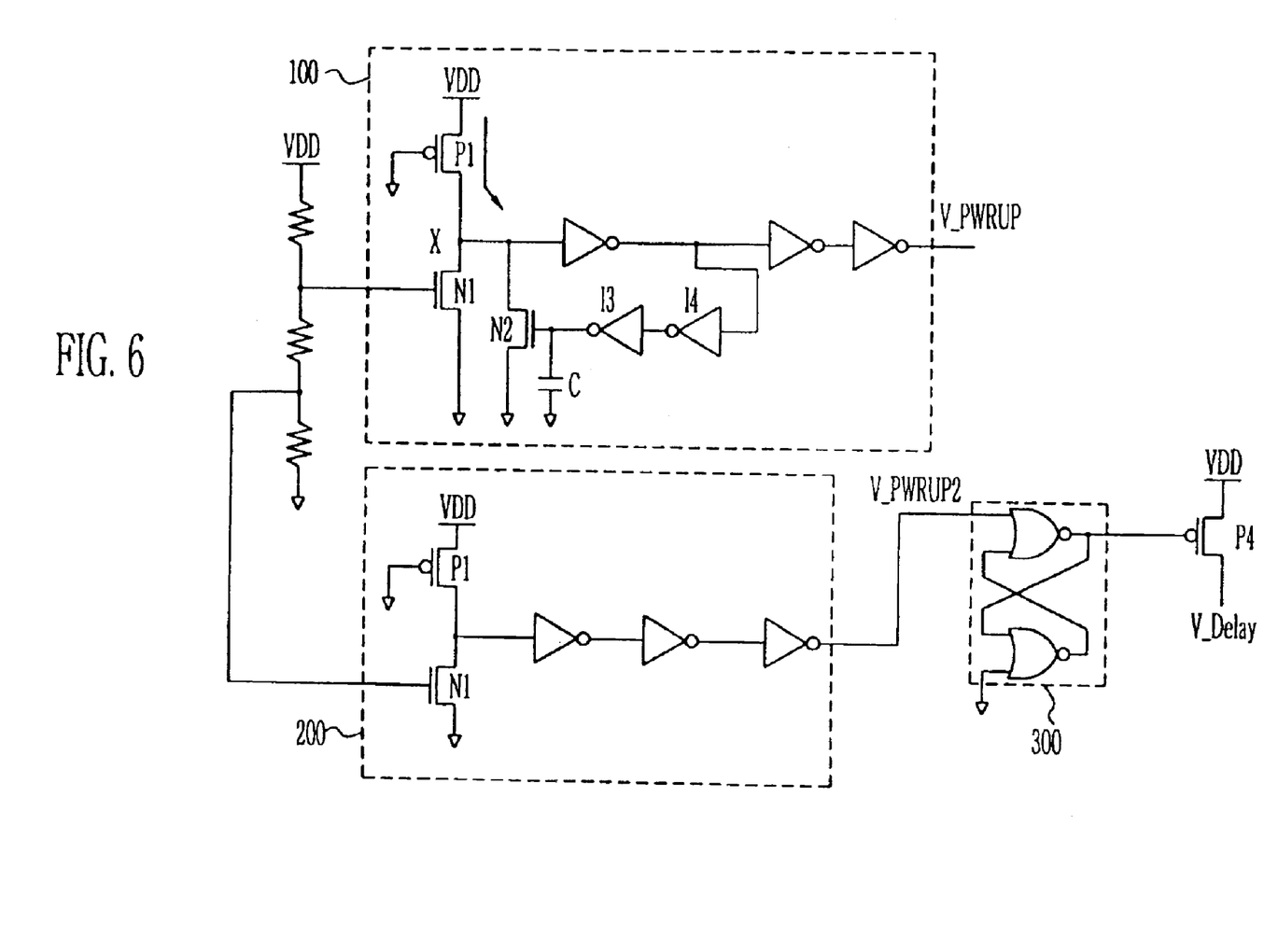
FIG. 6 shows a power-up circuit according to a fourth embodiment.

FIG. 6 shows a circuit diagram of a power-up circuit for solving the problem of the power-up circuit shown in FIG. 5a. In the power-up circuit shown in FIG. 6, the V_PWRUP2 power that can be obtained in the second power-up circuit 200 is not used as the V_Delay power but used as an input of a flip-flop 300 using a NOR gate. At this time, the flip-flop 300 is used to generate a control voltage of a PMOS transistor P4 to connect the VDD to the V_Delay. In the flip-flop 300 shown in FIG. 6, if V_PWRUP2 has a logical HIGH value, the gate voltage of the PMOS transistor P4 has a logical LOW value. Thus, the PMOS transistor P4 is turned on and the VDD value is then applied to the V_Delay. In other words, if the V_PWRUP2 is increased, the VDD value is transferred to the V_Delay. This becomes the voltage generated after the power up. Also, even when the V_PWRUP2 is turned due to power noise, the gate voltage of the PMOS transistor P4 has still as the logical LOW value due to a flip-flop characteristic. As the PMOS transistor P4 is thus kept turned off, the VDD value is transferred to the V_Delay.

As described above, methods of forming the power source having time delays are presented. The problem that the power source having a time delay being initially turned off due to power noise is solved.

Therefore, the disclosed circuits and methods advantageously prevent re-occurrence of an initialization operation due to power noise.

The disclosed circuits and methods have been described with reference to particular embodiments in connection with particular applications. Those having ordinary skill in the art and access to the teachings of the disclosure will recognize additional modifications and applications within the scope thereof.

It is therefore intended by the appended claims to cover any and all such applications, modifications, and embodiments within the scope of this disclosure.

What is claimed is:

1. A power-up circuit, comprising:

an inverter circuit for inverting a first signal at a to a second signal at a second node first node, wherein the inverter circuit is connected between a power supply and ground, the inverter circuit comprising:
  a plurality of transistors of a first conduction type connected to each other in series between the power supply and the second node; and
  a first transistor of a second conduction type connected between the second node and ground, wherein a control terminal of the first transistor of the second conduction type and a control terminal of each of the plurality of transistors of the first conduction type are connected to the first node; and a second transistor of the second conduction type connected between the first node and ground, wherein the second transistor of the second conduction type is turned on in response to the second signal at the second node.

2. The power-up circuit of claim 1, further comprising:

a third transistor of the first conduction type connected between the power supply and the first node;

a first voltage divider circuit for dividing power upon power up; and a fourth transistor of the second conduction type that is driven in response to an output of the first voltage divider circuit upon power up, wherein the fourth transistor of the second conduction type is connected between the first node and ground.

3. The power-up circuit of claim 2, further comprising:

a second voltage divider circuit for dividing the voltage of the first voltage divider circuit; and a logic signal generator for generating a logic signal in response to an output of the second voltage divider circuit.

4. The power-up circuit of claim 3, wherein the logic signal generator includes a flip-flop.

5. The power-up circuit of claim 1, further comprising a delay circuit for delaying the signal at the second node and driving the second transistor of the second conduction type.

6. The power-up circuit of claim 5, wherein the delay circuit includes an even number of inverters.

7. The power-up circuit of claim 6, wherein the delay circuit includes two inverters.

8. The power-up circuit of claim 1, wherein the first conduction type is p-type and the second conduction type is n-type.

* * * * *

UNITED STATES PATENT AND TRADEMARK OFFICE
CERTIFICATE OF CORRECTION

PATENT NO. : 6,870,408 B2  Page 1 of 1
DATED : March 22, 2005
INVENTOR(S) : Kyung W. Kim It is certified that error appears in the above-identified patent and that said Letters Patent is hereby corrected as shown below:

<u>Column 5,</u>
Lines 3-4, please delete "signal at a to a second signal at a second node first node" and insert -- signal at a first node to a second signal at a second node --.

Signed and Sealed this

Nineteenth Day of July, 2005

JON W. DUDAS
*Director of the United States Patent and Trademark Office*